(12) United States Patent
Mitani

(10) Patent No.: US 8,048,804 B2
(45) Date of Patent: Nov. 1, 2011

(54) METHOD OF MANUFACTURING SEMICONDUCTOR PACKAGE

(75) Inventor: Shogo Mitani, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/873,888

(22) Filed: Sep. 1, 2010

(65) Prior Publication Data

US 2010/0330746 A1    Dec. 30, 2010

Related U.S. Application Data

(63) Continuation of application No. 12/267,224, filed on Nov. 7, 2008, now Pat. No. 7,875,553.

(30) Foreign Application Priority Data

Nov. 9, 2007    (JP) ................................. 2007-292193

(51) Int. Cl.
  *H01L 21/44*    (2006.01)
(52) U.S. Cl. ........ 438/675; 438/455; 438/459; 438/598; 438/622; 438/677; 257/E21.585; 257/E21.599
(58) Field of Classification Search .................. 438/455, 438/459, 598, 622, 672, 677, 675; 257/E21.585, 257/E21.599
See application file for complete search history.

(56) References Cited

U.S. PATENT DOCUMENTS

2007/0207592 A1   9/2007 Lu et al.

FOREIGN PATENT DOCUMENTS

| JP | 2002-110852 A | 4/2002 |
|---|---|---|
| JP | 2002-134651 A | 5/2002 |
| JP | 2002-158191 A | 5/2002 |
| JP | 2002-210730 A | 7/2002 |
| JP | 2004-39897 A | 2/2004 |
| JP | 2004-351494 A | 12/2004 |
| JP | 2005-74663 A | 3/2005 |
| JP | 2006-108690 A | 4/2006 |
| JP | 2006-128434 A | 5/2006 |
| JP | 2006-156937 A | 6/2006 |
| JP | 2006-228947 A | 8/2006 |
| JP | 2006-303360 A | 11/2006 |
| JP | 2007-42824 A | 2/2007 |

*Primary Examiner* — Jarrett Stark
(74) *Attorney, Agent, or Firm* — Sughrue Mion, PLLC

(57) ABSTRACT

A method of manufacturing a semiconductor package, including at least a step A that forms a first transforming portion by irradiating a laser beam on at least a portion of a first substrate; a step B that joins together the first substrate and a second substrate in which a functional element is disposed; a step C that removes the first transforming portion that is disposed on the first substrate by etching; and a step D that forms a conductive portion in the first substrate by filling a conductive material in a portion where the first transforming portion has been removed.

8 Claims, 3 Drawing Sheets

METHOD OF MANUFACTURING SEMICONDUCTOR PACKAGE

CROSS-REFERENCE TO RELATED APPLICATIONS

This is a continuation of application Ser. No. 12/267,224 filed Nov. 7, 2008, which claims priority to JP 2007-292193 filed Nov. 9, 2007. The entire disclosure of the prior application, application Ser. No. 12/267,224, and is hereby incorporated by reference.

BACKGROUND OF THE INVENTION

1. Field of the Invention

The present invention relates to a method of manufacturing a semiconductor package that has through electrodes.

2. Description of Related Art

With the increasing sophistication of electrical equipment such as mobile telephones in recent years, there is a demand for further increases in the speed and performance of electronic devices and the like that are used in the equipment. In order to meet these demands, technical development is required not only to increase the speed of the device itself through miniaturization and the like, but also to increase the speed and density of the package of the device.

For technologies that achieve high-density mounting, three-dimensional stacking technology that laminates and mounts chips by providing fine through-electrodes in the chips and System in Package (SIP) technology that uses a substrate having through-electrodes formed therein have been proposed. Research and development of through-electrode formation technology and through-electrode substrate formation technology for realizing these mounting technologies have been conducted (for example, refer to related art Japanese Unexamined Patent Application, First Publication No. 2002-158191).

Also, as a microvia-formation technology, research has been conducted for forming microvias by transforming the substrate interior by a laser or the like and removing the transformed portion by etching (for example, refer to related art Japanese Unexamined Patent Application, First Publication No. 2006-303360).

Thinning of the substrate by polishing the rear surface of the substrate in order to reduce the size of the package has also been conducted. Also, in order to solve problems related to handling or the like during the thinning process, a method of joining a holding substrate to a substrate and polishing the silicon on the rear surface of the substrate has been proposed (for example, refer to related art Japanese Unexamined Patent Application, First Publication No. 2006-228947).

The abovementioned holding substrate is used, for example, when thinning the substrate, but is removed upon the completion of thinning the substrate. Also, with regard to a substrate in which through-electrodes are formed, a process for joining the manufactured substrate together with a substrate in which a functional element is arranged is required. Thus, the manufacturing time increases. Since the method disclosed in related art Japanese Unexamined Patent Application, First Publication No. 2006-228947 involves removing the holding substrate that was joined for thinning a substrate and laminating again a substrate for forming through electrodes, the manufacturing time increases.

The present invention was made in view of the related circumstances, and has an object of providing a method of manufacturing a semiconductor package that eliminates the need for removing the holding substrate after the completion of processing of the semiconductor substrate and is thereby capable of reducing the manufacturing time.

SUMMARY OF THE INVENTION

The present invention provides a method of manufacturing a semiconductor package which includes a step A that forms a first transforming portion by irradiating a laser beam on at least a portion of a first substrate; a step B that joins together the first substrate and a second substrate in which a functional element is disposed; a step C that removes the first transforming portion that is disposed on the first substrate by etching; and a step D that forms a conductive portion in the first substrate by filling a conductive material in a portion where the first transforming portion has been removed.

In the method of manufacturing a semiconductor package according to the present invention, the method may further include a step E that processes of thinning the second substrate after the step B. Step E may be performed immediately following step B.

In the method of manufacturing a semiconductor package according to the present invention, in the step A, the first transforming portion may be formed so as to pass through the first substrate; and in the step D, the conductive portion may be formed so as to be electrically connected to the functional element.

In the method of manufacturing a semiconductor package according to the present invention, in the step A, a second transforming portion that has the same pattern as a scribe line that is used for dicing the second substrate for each functional element may be formed in the first substrate by irradiating laser beam.

In the method of manufacturing a semiconductor package according to the present invention, the first substrate may have an alignment process portion for joining with the second substrate.

In the present invention, the through-electrode (conductive portion) is formed in the first substrate by forming the first transforming portion by irradiating a laser beam on at least a portion of the first substrate that is to be joined (or has been joined) with the second substrate, etching the first transforming portion after processing or before processing of the second substrate, and filling the conductive material in the portion where the first transforming portion has been removed. Thereby, the first substrate serves as a holding substrate when processing the second substrate, and after completion of the processing of the second substrate, the first substrate becomes a substrate for forming the through-electrode therein. As the result it is possible in the present invention to provide a method of manufacturing a semiconductor package that eliminates the need for removing the first substrate after the completion of the processing of the second substrate, and so is thereby capable of reducing the manufacturing time.

DETAILED DESCRIPTION OF THE INVENTION

Exemplary embodiments of the present invention will now be described more fully with reference to the accompanying drawings.

Figure 1:
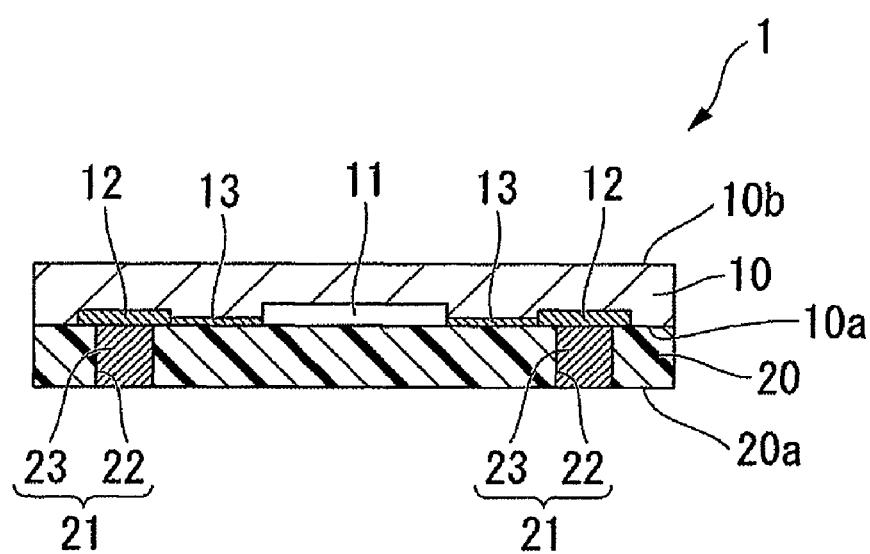
FIG. 1 is a cross-sectional view that shows an exemplary embodiment of a semiconductor package that is manufactured by a method of the present invention.

FIG. 1 is a cross-sectional view that shows an exemplary embodiment of a semiconductor package that has been manufactured by the semiconductor package manufacturing method of the present invention.

This semiconductor package 1 is provided with at least a second substrate 10, a functional element 11 that is disposed in a first surface 10a of the second substrate 10, and a first substrate 20 that is disposed so as to face the first surface 10a of the second substrate 10.

The second substrate 10 is a semiconductor substrate, such as silicon. In the second substrate 10, the functional element 11 and an electrode pad 12 are formed on the first surface 10a, and the functional element 11 and the electrode pad 12 are electrically connected via a wiring portion 13.

The functional element 11 is an element with a fine three-dimensional structure, such as an image sensor like a solid-state image sensor (e.g. a charged-coupled device (CCD)) or a Micro Electro Mechanical System (MEMS) device. The MEMS device includes, for example, a micro-relay, a micro-switch, a pressure sensor, an acceleration sensor, a high-frequency filter, and a micro-mirror and the like.

The electrode pad 12 and the wiring portion 13 are made from a material having excellent conductivity such as aluminum (Al), copper (Cu), aluminum-silicon (Al—Si) alloy, or aluminum-silicon-copper (Al—Si—Cu) alloy and the like.

The first substrate 20 is disposed so as to face the first surface 10a of the second substrate 10 and has a role of protecting the functional element 11. As the first substrate 20, it is possible to use a substrate made of resin or glass or the like.

The first substrate 20 is provided with a through-electrode 21 that electrically connects a first surface 20a and the electrode pad 12 that is disposed on the second substrate 10.

The through-electrode 21 is formed by filling a conductive material 23 in the inner surface of a microvia (through-hole 22) that passes through both of the front and rear surfaces of the first substrate 20. An insulating film may be disposed on the inner surface of the through-hole 22.

The manufacturing method of the semiconductor substrate 1 of the present invention includes at least a step A that forms a first transforming portion 24 by irradiating laser beam on at least a portion of the first substrate 20, a step B that bonds together the first substrate 20 and the second substrate 10 in which the functional element 11 is disposed, a step C that removes the first transforming portion 24 that is disposed in the first substrate 20 by etching, and a step D that forms a conductive portion in the first substrate 20 by filling the conductive material 23 in the portion where the first transforming portion 24 has been removed.

In the present invention, the through-electrode 21 (conductive portion) is formed in the first substrate 20 by forming the first transforming portion 24 by irradiating laser beam on at least a portion of the first substrate 20 that is to be joined (or has been joined) with the second substrate 10, etching the first transforming portion 24 after processing or before processing of the second substrate 10, and filling the conductive material 23 in the portion where the first transforming portion 24 has been removed. Thereby, the first substrate 20 serves as a holding substrate when processing the second substrate 10, and after completion of the processing becomes a layer in which the through-electrode 21 is formed. As a result, in the present invention, the need to remove the first substrate 20 after the completion of processing of the second substrate 10 is eliminated, and so it is possible to reduce the manufacturing time.

Hereinbelow, the method of manufacturing a semiconductor package of the present invention will be described. FIGS. 2A to 2E are cross-sectional views that schematically show an exemplary method of manufacturing the semiconductor package of the present invention (first exemplary embodiment) in the process sequence.

Figure 2A:
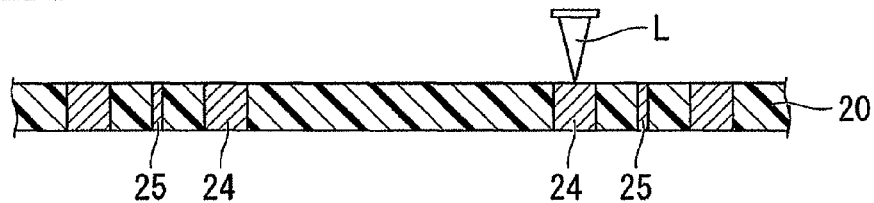
FIGS. 2A to 2E are cross-sectional views that show, step-by-step, an example of the method of manufacturing the semiconductor package of the present invention.

(1) First, as shown in FIG. 2A, the first transforming portion 24 is formed by irradiating laser beam L on at least a portion of the first substrate 20 (step A).

Here, the first transforming portion 24 is formed so as to pass through both of the front and rear surfaces of the first substrate 20. Thereby, it is possible to form the through-electrode 21 in the first substrate 20.

Also, in the step A, a second transforming portion 25 may be formed that has the same pattern as scribe lines (refer to A1, A2 in FIG. 2E) when dicing the second substrate 10 for each functional element, in the first substrate 20 by irradiating the laser beam L. Thereby, by etching the second transforming portion 25 simultaneously with the first transforming portion 24 in a later step, it is possible to remove the portion corresponding to the scribe lines of the second substrate 10. Thus, it is possible to simplify the dicing.

Note that, the first substrate 20 may have alignment marks (alignment process portion, not illustrated) to use when joining with the second substrate 10. Thereby, it is possible to align the first transforming portion 24 with a given position on the second substrate 10 when joining the first substrate 20 and the second substrate 10 in the step B described below.

Figure 2B:
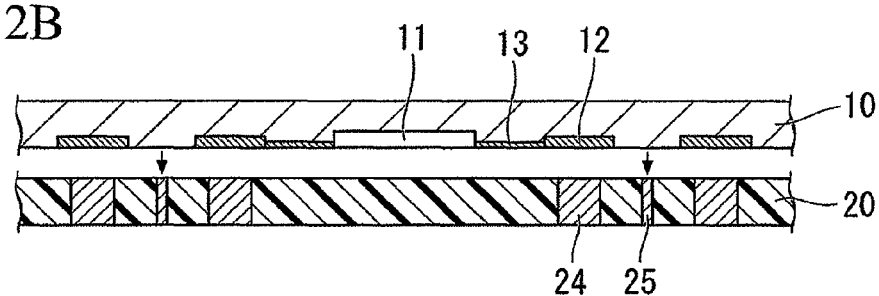

(2) Next, as show in FIG. 2B, the first substrate 20 in which the first transforming portion 24 is disposed and the second substrate 10 in which the functional element 11 is disposed are joined together (step B).

Bonding by resin and, provided that there is no influence on the functional element 11, anodic bonding can be used to join the first substrate 20 and the second substrate 10. In the case in which bonding is performed by resin, it is possible to use, for example, an epoxy resin or photosensitive BCB resin as the adhesive resin (adhesive agent) that is to be used. The method of applying the adhesive agent is not particularly restricted, and so it is possible to use such methods as stamping, dispensing, spin coating, and spray coating.

Figure 2C:
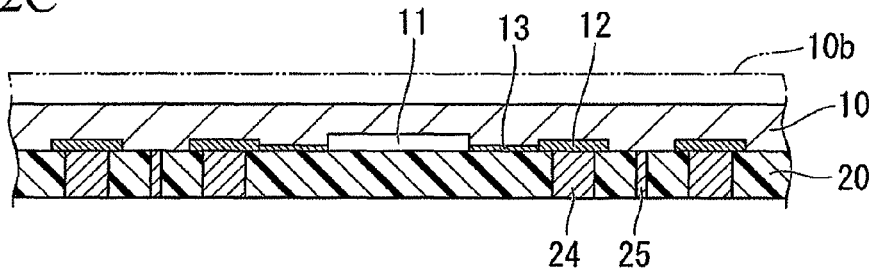

(3) Next, as shown in FIG. 2C, the second substrate 10 is processed into a thin plate (step E).

By performing polishing and the like on the second surface 10b of the second substrate 10, it is possible to perform thinning and the like of the second substrate 10. At this time, by utilizing the first substrate 20 as a holding substrate, the processing of the second substrate 10 is simplified. With the above method, it is possible to achieve a thin plate of the semiconductor package 1 with simple steps.

Figure 2D:
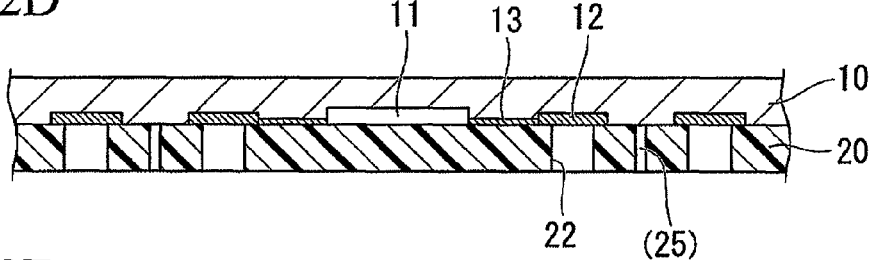

(4) Next, as shown in FIG. 2D, the first transforming portion 24 and the second transforming portion 25 that are disposed in the first substrate 20 are removed by etching (step C).

By immersing the substrate in an etching solution, etching of the first transforming portion 24 and the second transforming portion 25 of the first substrate 20 is performed. Hydrofluoric acid may be used as the etching solution.

Since the first transforming portion 24 is formed so as to pass through both of the front and rear surfaces of the first substrate 20, a microvia (through-hole 22) that passes through both of the front and rear surfaces of the first substrate 20 is formed at that portion where the first transforming portion 24 is removed. The diameter, work dimensions and the like of the through-hole 22 that is formed in this manner are suitably set in accordance with the use or the like, and moreover the cross-sectional shape (shape of the perpendicular cross-section in axial direction) of the through-hole 22 may be any shape such as circular, elliptical, triangular, and rectangular (including square).

Also, by etching the second transforming portion 25 simultaneously with the first transforming portion 24, it is possible to remove the portion corresponding to the scribe lines of the second substrate 10. By doing so, it is possible to simplify the dicing in a subsequent step.

Figure 2E:
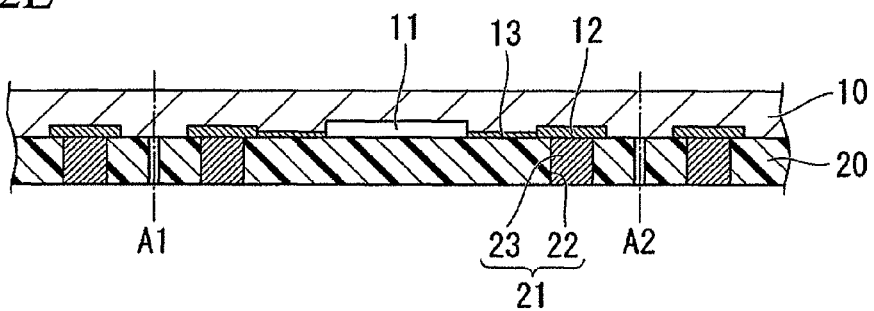

(5) Next, as shown in FIG. 2E, a conductive portion is formed in the first substrate 20 by filling the conductive material 23 in the portion where the first transforming portion 24 has been removed (step D).

The conductive material 23 is filled in the through-hole 22 that is opened by etching. Thereby, the through-electrode 21 is formed. The method of filling the conductive material 23 in the through-hole 22 is not particularly restricted, and so it is possible for example to use a molten-metal suction method, a plating method, and a vacuum printing method, or the like.

As the metal that is used as the conductive material 23, it is possible to use a metal such as tin (Sn) or indium (In), an alloy such as gold-tin (Au—Sn) of a suitable composition, an alloy of tin-lead (Sn—Pb), or a solder, such as a tin (Sn) based, lead (Pb) based, gold (Au) based, indium (In) based, or aluminum (Al) based solder.

The through-electrode 21 that is formed in this manner is electrically connected to the functional element 11.

(6) Lastly, the semiconductor package 1 is obtained that has the through-electrodes shown in FIG. 1 by cutting at lines (scribe lines) A1, A2 shown in FIG. 2E. At this time, since the portion of the second transforming portion 25 has been removed, it is possible to simplify the dicing.

As stated above, according to the manufacturing method of the present invention, the first substrate serves as a holding substrate when processing the second substrate, and after the completion of processing, becomes a layer in which the through-electrode is formed. As a result, in the present invention, the need to remove the first substrate after the completion of processing is eliminated, and so it is possible to reduce the manufacturing time.

Next, a second exemplary embodiment of a manufacturing method of the semiconductor package 1 of the present invention will be described.

In the aforementioned first exemplary embodiment, the example was given of the case of joining together the first substrate 20 and the second substrate 10 (step B) after forming the first transforming portion 24 in the first substrate 20 (step A). However, in the second exemplary embodiment, after joining together the first substrate 20 and the second substrate 10 (step B), the first transforming portion 24 is formed in the first substrate 20 (step A). In this way, by forming the first transforming portion 24 after joining together the first substrate 20 and the second substrate 10, it is possible to prevent misalignment between the first transforming portion 24 (which subsequently becomes the through-electrodes 21) and the substrate pattern.

FIGS. 3A to 3E are cross-sectional views that schematically show the method of manufacturing the semiconductor package of the present invention (second exemplary embodiment) in the process sequence.

Note that other than the difference in the order of steps, the second exemplary embodiment is mostly the same as the first exemplary embodiment, so a detailed explanation will be omitted here.

Figure 3A:
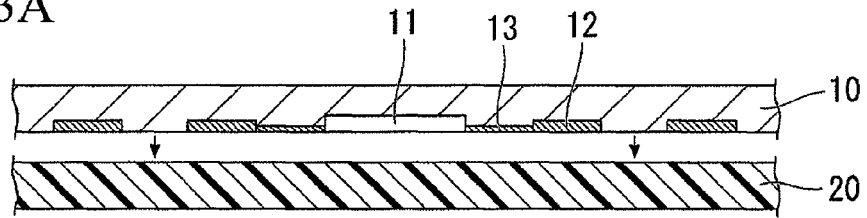
FIGS. 3A to 3E are cross-sectional views that show, step-by-step, another example of the method of manufacturing the semiconductor package of the present invention.

(11) First, as shown in FIG. 3A, the first substrate 20 and the second substrate 10 in which the functional element 11 is disposed are joined together (step B).

Figure 3B:
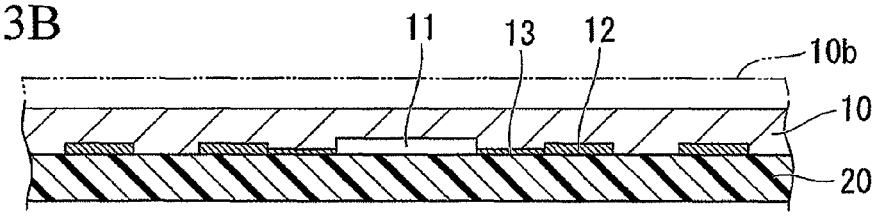

(12) Next, as shown in FIG. 3B, the second substrate 10 is processed into a thin plate (step E).

Figure 3C:
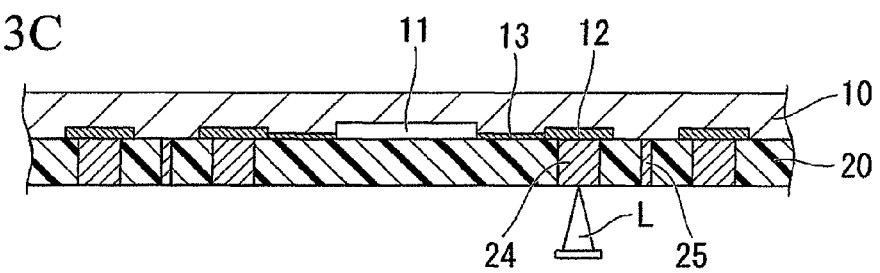

(13) Next, as shown in FIG. 3C, the first transforming portion 24 is formed by irradiating laser beam L on at least a portion of the first substrate 20 (step A).

Figure 3D:
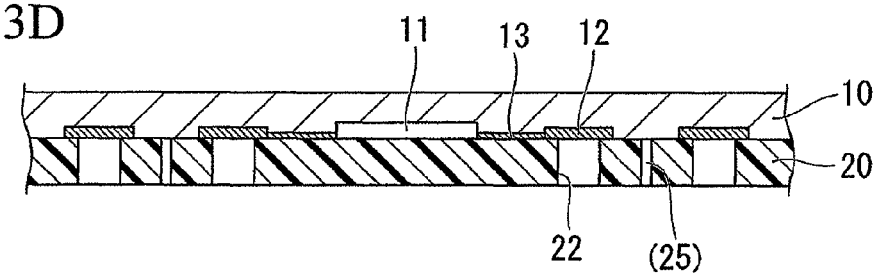

(14) Next, as shown in FIG. 3D, the first transforming portion 24 and the second transforming portion 25 that are disposed in the first substrate 20 are removed by etching (step C).

Figure 3E:
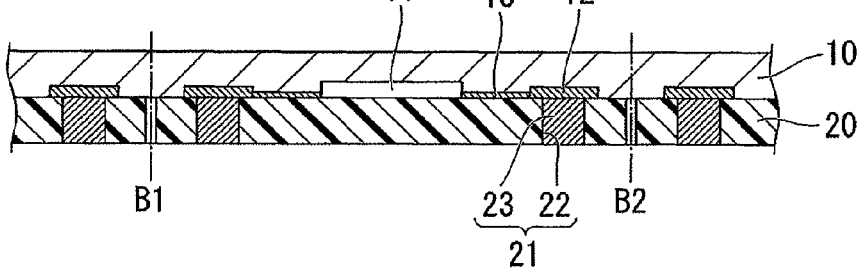

(15) Next, as shown in FIG. 3E, a conductive portion is formed in the first substrate 20 by filling the conductive material 23 in the portion where the first transforming portion 24 has been removed (step D).

(16) Lastly, the semiconductor package 1 is obtained that has the through-electrode shown in FIG. 1 by cutting at lines (scribe lines) B1, B2 shown in FIG. 3E.

In this manner, in the present embodiment, the first substrate serves as a holding substrate when processing the second substrate, and after the completion of processing, becomes a layer in which the through-electrode is formed. As a result, in the present invention, the need to remove the first substrate after the completion of processing of the second substrate is eliminated, and so it is possible to reduce the manufacturing time.

While exemplary embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, in the aforementioned embodiments, only the portion corresponding to one functional element on the semiconductor substrate were illustrated, but the present invention can also be applied to a semiconductor package that is provided with a plurality of functional elements.

The present invention can be widely applied to a method of manufacturing a semiconductor package that has through-electrodes.

What is claimed is:

1. A method of manufacturing a semiconductor package, comprising:
   a step A, forming a first transforming portion by irradiating a laser beam on at least a portion of a first substrate;
   a step B, joining together the first substrate and a second substrate in which a functional element is disposed;
   a step C, removing the first transforming portion that is disposed on the first substrate by etching;
   a step D, forming a conductive portion in the first substrate by filling a conductive material in a portion where the first transforming portion has been removed; and
   a step E, thinning the second substrate;
   wherein the step E is preformed before the step D.

2. The method of manufacturing a semiconductor package according to claim 1, wherein the step E is performed after the step B.

3. The method of manufacturing a semiconductor package according to claim 2, wherein the step E is performed immediately following the step B.

4. The method of manufacturing a semiconductor package according to claim 2, wherein an order of steps includes performing the step A, the step B, the step E, the step C and the step D in that order.

5. The method of manufacturing a semiconductor package according to claim 2, wherein an order of steps includes performing the step B, the step E, the step A, the step C and the step D in that order.

6. The method of manufacturing a semiconductor package according to claim 1, wherein:

in the step A, the first transforming portion is formed so as to pass through the first substrate, passing through both a front surface and a rear surface of the first substrate; and in the step D, the conductive portion is formed so as to be electrically connected to the functional element.

7. The method of manufacturing a semiconductor package according to claim 1, wherein the first substrate has an alignment process portion which joins with the second substrate.

8. The method of manufacturing a semiconductor package according to claim 1, wherein the first substrate is made of resin or glass, and the second substrate is made of a semiconductor material.

* * * * *